United States Patent
Baek et al.

(10) Patent No.: US 8,619,458 B2
(45) Date of Patent: Dec. 31, 2013

(54) BIDIRECTIONAL RESISTIVE MEMORY DEVICES USING SELECTIVE READ VOLTAGE POLARITY

(75) Inventors: In-Gyu Baek, Seoul (KR); Hyung-Rok Oh, Yongin-si (KR); Hong-Sun Hwang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 43 days.

(21) Appl. No.: 13/349,167

(22) Filed: Jan. 12, 2012

(65) Prior Publication Data

US 2012/0182786 A1    Jul. 19, 2012

(30) Foreign Application Priority Data

Jan. 13, 2011    (KR) .......................... 10-2011-0003617

(51) Int. Cl.
*G11C 13/00*    (2006.01)

(52) U.S. Cl.
USPC ..................... 365/148; 365/189.07

(58) Field of Classification Search
USPC ............................. 365/148, 189.07
See application file for complete search history.

(56) References Cited

U.S. PATENT DOCUMENTS

| 2010/0046273 | A1* | 2/2010 | Azuma et al. ................. 365/148 |
| 2011/0103133 | A1* | 5/2011 | Okada et al. ................. 365/148 |
| 2011/0128772 | A1* | 6/2011 | Kim et al. ..................... 365/148 |
| 2011/0216574 | A1* | 9/2011 | Ichihara et al. .............. 365/148 |

FOREIGN PATENT DOCUMENTS

| JP | 2006-114087 | 4/2006 |
| JP | 2006-190376 | 7/2006 |
| JP | 4252624 | 4/2009 |

* cited by examiner

*Primary Examiner* — Michael Tran
(74) *Attorney, Agent, or Firm* — Myers Bigel Sibley & Sajovec, P.A.

(57) ABSTRACT

A memory device includes a memory cell array including a plurality of memory cells, each including a bidirectional variable resistance element and an input/output circuit configured to determine a polarity for a read voltage to be applied to a selected memory cell among the plurality of memory cells and to apply the read voltage with the determined polarity to the selected memory cell. The input/output circuit may include a polarity determination circuit configured to determine the polarity responsive to a determination mode signal and a driver circuit configured to apply the read voltage with the determined polarity to the selected memory cell.

18 Claims, 5 Drawing Sheets

BIDIRECTIONAL RESISTIVE MEMORY DEVICES USING SELECTIVE READ VOLTAGE POLARITY

CROSS-REFERENCE TO RELATED APPLICATION

This application claims priority from Korean Patent Application No. 10-2011-0003617 filed on Jan. 13, 2011 in the Korean Intellectual Property Office, and all the benefits accruing therefrom under 35 U.S.C. 119, the contents of which in its entirety are herein incorporated by reference.

BACKGROUND

The inventive subject matter relates to semiconductor memory devices, and more particularly, to memory devices having variable resistance memory cells.

Semiconductor memory devices are used to store data. These devices may be classified as volatile semiconductor memory devices and non-volatile semiconductor memory devices. Volatile semiconductor memory devices may store data by charging and discharging a capacitor, and include semiconductor memory devices such as a random access memory (RAM). Volatile memory devices typically store and read data when power is applied and may lose data when power is interrupted. Volatile semiconductor memory devices are commonly used, for example, for main memory of a computer.

Nonvolatile semiconductor memory devices typically retain data even when power is interrupted. Nonvolatile semiconductor memory devices are commonly used to store programs and data in a wide range of applications, including computers and portable communication devices.

To address demands for increased memory capacity and low power consumption, next-generation non-volatile memory devices of various types have been researched. For example, a phase change random access memory (PRAM) (which uses phase change materials), a resistance random access memory (RRAM) (which uses materials having variable resistance such as transition-metal oxides), and a magnetic random access memory (MRAM) (which uses ferromagnetism materials) are attracting attention as potential next-generation memory devices. The memory storage materials used in such devices share common characteristics, such as resistance that is variable depending on magnitude and/or direction of applied voltage and/or current, with the resistance being maintained without requiring sustained applied voltage and/or current (e.g., refresh is not required).

Memory cells in such resistive memory devices may include a resistive element and a switching element. The switching element commonly is connected between variable resistance element and a word line. Resistive memory device typically include an array of such resistive memory cells.

Resistive memory cells may be classified at PRAM, RRAM, MRAM, etc., depending on materials used for the resistive element of the memory cell. For example, the resistive element of a PRAM cell may include phase change materials such as Ge-Sb-Te, resistance of which is varied depending on temperature. The resistive element of a RRAM cell may include a top electrode, a bottom electrode and transition-metal oxide (complex metal oxide) between the top and bottom electrodes. The resistive element of a MRAM cell may include a magnetic top electrode, a magnetic bottom electrode and dielectric materials between the top and bottom electrodes.

Resistive memory cells may be classified as a unidirectional resistive memory cell, in which its resistance changes depending on the magnitude of the applied voltage or current, or a bidirectional resistive memory cell, in which its resistance changes depending on the direction as well as the magnitude of the applied voltage or current.

SUMMARY

Some embodiments of the inventive subject matter provide a memory device including a memory cell array including a plurality of memory cells, each including a bidirectional variable resistance element. The memory device further includes an input/output circuit configured to determine a polarity for a read voltage to be applied to a selected memory cell among the plurality of memory cells and to apply the read voltage with the determined polarity to the selected memory cell. The input/output circuit may include a polarity determination circuit configured to determine the polarity responsive to a determination mode signal and a driver circuit configured to apply the read voltage with the determined polarity to the selected memory cell.

In some embodiments, the polarity determination circuit may be configured to store polarity information for the selected variable resistance element and to determine the polarity of the read voltage based on the stored polarity information. In further embodiments, the input/output circuit may be configured to evaluate candidate read voltages having different polarities and to responsively apply a selected one of candidate read voltages to the selected memory cell. The memory cell array may include at least one reference memory cell, and the input/output circuit may be configured to evaluate the candidate read voltages using the reference memory cell.

In some embodiments, the variable resistance element may include a non-ohmic material element and a resistive material element connected in series. The resistive material element may include a phase change material, a transition metal oxide and/or a ferromagnetic material. The variable resistance element may provide least three different resistance states, and the memory cells may be multi-level memory cells.

In further embodiments, a memory device includes a memory cell array including a plurality of memory cells, each including a variable resistance element and a bidirectional access element. The memory device further includes an input/output circuit including a polarity determination circuit configured to determine a polarity of a read voltage to be applied to a selected memory cell among the plurality of memory cells and a bit line and source line driver circuit configured to apply the read voltage to a bit line and a source line such that the polarity determined by the polarity determination circuit is applied to the selected memory cell.

The polarity determination circuit may be configured to be enabled by a polarity determination mode signal and to output a polarity selection signal responsive to the determined polarity of the read voltage, and the bit line and source line driver may be configured to apply the read voltage to the bit line and the source line responsive to the polarity selection signal. The polarity determination circuit may be configured to store information on the polarity of the read voltage corresponding to switching characteristics of the variable resistance element and determines the polarity of the read voltage based on the information. The polarity determination circuit may be configured to identify one of a first candidate read voltage and a second candidate read voltage of different polarities that enables a larger current to flow in the variable resistance element. The memory cell array may include at least one reference memory cell, and the polarity determination circuit may be configured to test the first candidate read voltage and the second candidate read voltage on the reference memory cell to determine the polarity of the read voltage.

BRIEF DESCRIPTION OF THE DRAWINGS

The above and other features and advantages of the inventive subject matter will become more apparent by describing in detail embodiments thereof with reference to the attached drawings in which.

DETAILED DESCRIPTION

Advantages and features of the inventive subject matter may be understood more readily by reference to the following detailed description of embodiments and the accompanying drawings. The inventive subject matter may, however, be embodied in many different forms and should not be construed as being limited to the embodiments set forth herein. Rather, these embodiments are provided so that this disclosure will be thorough and complete and will fully convey the concept of the invention to those skilled in the art, and the inventive subject matter will only be defined by the appended claims. In the drawings, the thickness of layers and regions are exaggerated for clarity.

It will be understood that when an element or layer is referred to as being "connected to" or "coupled to" another element or layer, it can be directly on or connected to the other element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the inventive subject matter.

Embodiments described herein will be described referring to plan views and/or cross-sectional views by way of ideal schematic views of the invention. Accordingly, the exemplary views may be modified depending on manufacturing technologies and/or tolerances. Therefore, the embodiments of the invention are not limited to those shown in the views, but include modifications in configuration formed on the basis of manufacturing processes. Therefore, regions exemplified in figures have schematic properties and shapes of regions shown in figures exemplify specific shapes of regions of elements and not limit aspects of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, although exemplary embodiments of the inventive subject matter will be described as using a resistive RAM (RRAM), various embodiments of the inventive subject matter may be applied to any of a variety of other kinds of nonvolatile memory devices using a resistive element, such as phase change random access memories (PRAM), and magnetic RAMs (MRAM).

Figure 1:
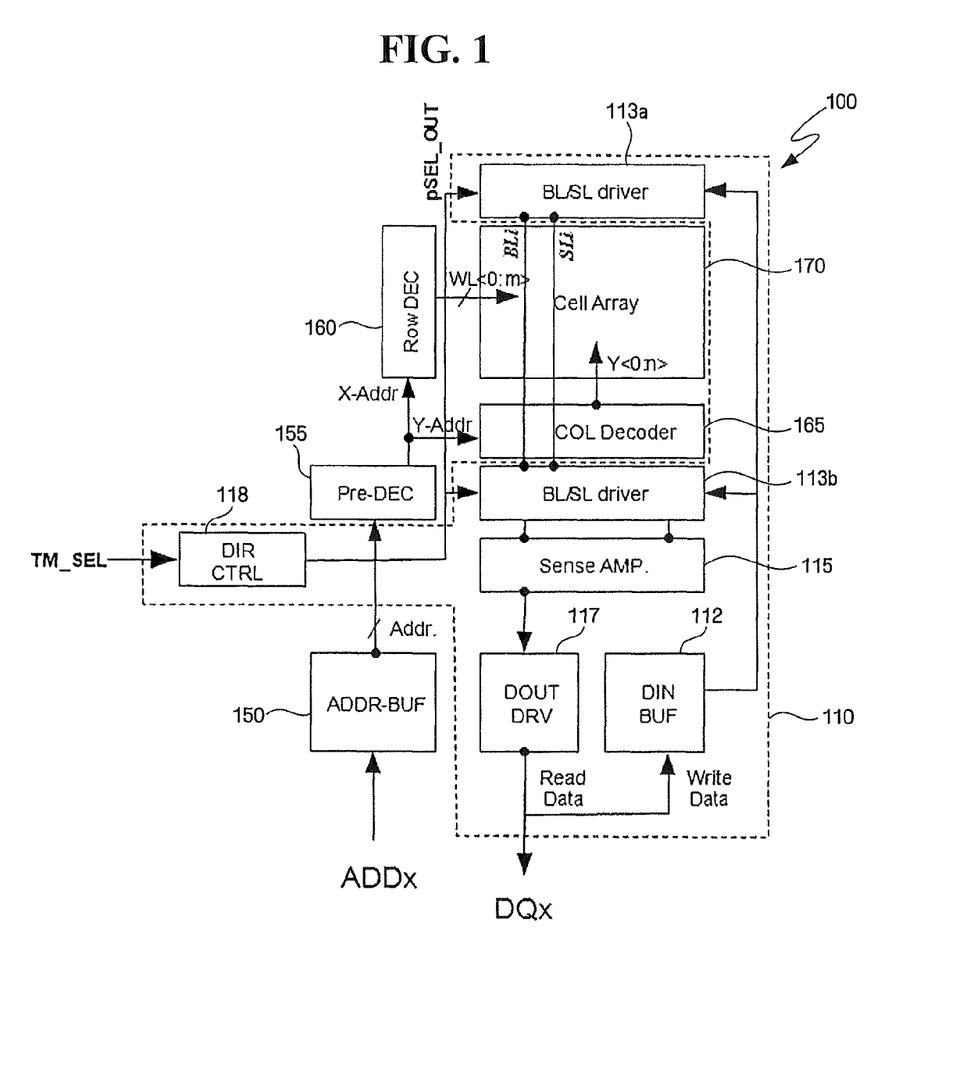
FIG. 1 is a block diagram illustrating a bidirectional resistive memory device according to some embodiments of the inventive subject matter.
Figure 2:
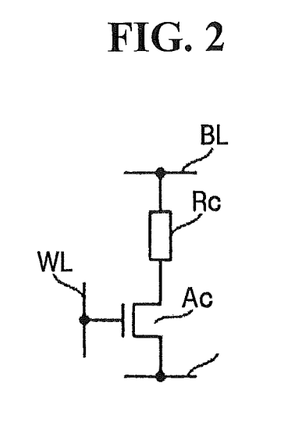
FIG. 2 is a circuit diagram illustrating an example of a circuit resistive memory cell for the resistive memory device shown in FIG. 1.
Figure 3:
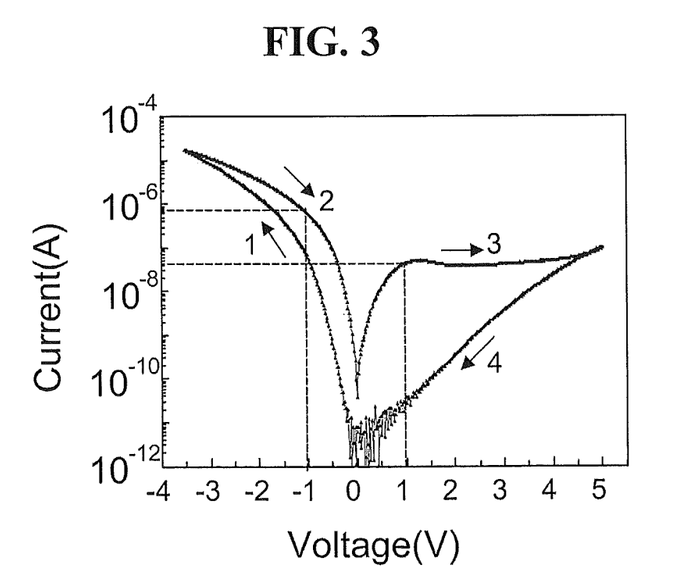
FIG. 3 is a graph illustrating bipolar switching for a variable resistance element of a bidirectional resistive memory device according to some embodiments of the inventive subject matter.

Hereinafter, a bidirectional resistive memory device according to some embodiments of the inventive subject matter will be described with reference to FIGS. 1 to 3. In particular, FIG. 1 is a block diagram illustrating a bidirectional resistive memory device according to some embodiments of the inventive subject matter. FIG. 2 is a circuit diagram illustrating an example of a circuit resistive memory cell for the resistive memory device shown in FIG. 1. FIG. 3 is a graph illustrating bipolar switching for a variable resistance element of a bidirectional resistive memory device according to some embodiments of the inventive subject matter.

Referring to FIG. 1, the bidirectional resistive memory device 100 includes an input/output circuit 110 and a variable resistance memory cell array 170. The input/output circuit 110 generates voltages corresponding to input data, specifically, a positive-polarity voltage and a negative-polarity voltage, and supplies the positive-polarity voltage and the negative-polarity voltage to the variable resistance memory cell array 170 in response to a logic state of the input data.

In addition, the input/output circuit 110 outputs the data stored in the variable resistance memory cell array 170. Unlike in a memory cell array of a unidirectional resistive memory device, in the memory cell array 170 of the bidirectional resistive memory device 10, voltages applied to the memory cells may have different polarities according to the input data.

In other words, the input/output circuit 110 includes a polarity determination circuit 118 and bit line and source line drivers 113a and 113b. The polarity determination circuit 118 is enabled by a polarity determination mode signal TM_SEL and outputs a polarity selection signal pSEL_OUT. The bit line and source line drivers 113a and 113b receive the polarity selection signal pSEL_OUT and apply a read voltage to a bit line and source line. The polarity determination circuit 118 determines the polarity of the read voltage applied to one selected among a plurality of memory cells. In addition, the bit line and source line drivers 113a and 113b apply a read voltage having the polarity determined by the polarity determination circuit 118 to opposite ends of the selected memory cell.

More specifically, polarity determination circuit 118 enabled by the polarity determination mode signal TM_SEL and determines the polarity of the read voltage to then output the polarity selection signal pSEL_OUT. The polarity selection signal pSEL_OUT is transmitted to the bit line and source line drivers 113*a* and 113*b*, and the bit line and source line drivers 113*a* and 113*b*, having received the polarity selection signal pSEL_OUT, may apply the read voltage having the selected polarity to the opposite ends of the memory cell.

In some embodiments, the polarity determination circuit 118 may store information regarding the polarity of the read voltage corresponding to a switching characteristic of the variable resistance element. Based on the information, the polarity of the read voltage may be determined, which will later be described in detail with reference to FIG. 3.

In addition, the input/output circuit 110 may include an input buffer (DIN BUF) 112 related to data input, a sense amplifier (Sense AMP) 115 related to data input, and an output driver (DOUT DRV) 117. The input buffer 112 may supply a voltage corresponding to input data (Write Data) to the selected bit line connected to the memory cell array 170. Although not shown, the input buffer 112 may include a positive polarity voltage generation circuit that generates a positive polarity voltage and a negative polarity voltage generation circuit that generates a negative polarity voltage. In addition, the input buffer 112 may select one of the positive and negative polarity voltages generated at the respective voltage generation circuits according to the supplied input data to then supply the selected voltage to the selected memory cell through a bit line.

The sense AMP 115 compares a voltage of the bit line BL with a sensing reference voltage and generates a sensing output voltage. The output driver 117 outputs output data (Read Data) based on the sensing output voltage. Although not shown, the sense AMP 115 may be connected to a bit line precharge circuit and a bit line discharge circuit.

The bidirectional resistive memory device may include an address buffer (ADDR-BUF) 150, a pre-decoder (Pre-DEC) 155, a row decoder (ROW DEC) 160, and a column decoder (COL Decoder) 165, in addition to the input/output circuit 110.

The address buffer 150 may output an address Addr. The pre-decoder 155 generates a row address X-Addr and a column address Y-Addr based on the address Addr. The row decoder 160 generates word line driving signals WL0~WLn based on the row address X-Addr to then provide the same to the memory cell array 170. The column decoder 165 decodes the column address Y-Addr and generates a column selection signal to then provide the same to the memory cell array 170.

Referring to FIG. 2, a unit memory cell includes a variable resistance element Rc having a terminal connected to a bit line BL, and a bidirectional access element Ac coupled between the variable resistance element Rc and a source line SL and controlled by a word line WL. The variable resistance element Rc may be implemented by, for example, connecting in series an element made of a non-ohmic material and an element made of a resistive material. The non-ohmic material may have a high resistance state in a predetermined voltage range and may have a low resistance state beyond the predetermined voltage range. The resistive material may include, for example, a phase change material, a transition metal oxide or a ferromagnetic material.

Therefore, the variable resistance element may be a bipolar element having a predetermined resistance value and enabling current to flow in the variable resistance element when the polarity of a voltage applied to opposite ends thereof is either positive or negative. Thus, for example, data may be set to "1" when the voltage of the bit line connected to the variable resistance element is a positive voltage, while data may be set to "0" when the voltage of the bit line connected to the variable resistance element is a negative voltage. This is provided only as an exemplary embodiment, as the bipolar element may also be implemented in various other ways.

The bidirectional access element Ac enables the current passing through the variable resistance element Rc to flow in a bidirectional way (that is, from top to bottom, or bottom to top). For example, the bidirectional access element Ac may include, but is not limited to, two diodes coupled to each other in opposite directions (antiparallel). A variety of other kinds of elements may be employed as the bidirectional access element Ac.

Hereinafter, a bidirectional resistive memory device including a variable resistance element having a bipolar switching characteristic as shown in FIG. 3 will be described.

As shown in FIG. 3, if a voltage applied to opposite ends of a memory cell in an initial state is gradually reduced from 0 V to a negative voltage, and the value of current flowing in the variable resistance element gradually increases. If the applied voltage is continuously driven more negative, the value of current flowing in the variable resistance element Rc increases along the line 1. If the applied voltage is driven positive towards 0 V, the current flowing in the variable resistance element Rc varies along the line 2. As can be seen, two resistance states, that is, a high resistance state and a low resistance state, are available for the same voltage applied.

If the applied voltage is gradually increased from 0 V to a positive voltage, the value of current flowing in the variable resistance element Rc gradually increases. If the applied voltage is continuously increased in the positive direction, the value of current flowing in the variable resistance element Rc increases along the line 3 of FIG. 3. If the applied voltage is reduced, the value of current flowing in the variable resistance element Rc varies along the line 4. Thus, two resistance states, that is, a high resistance state and a low resistance state, are available when the applied voltage is a positive voltage, Therefore, the bidirectional resistive memory device is characterized in that resistance values vary according to the magnitude and direction of the voltage or current applied thereto. In addition, as shown in FIG. 3, in the bidirectional resistive memory device, magnitudes of the current flowing in the variable resistance element may differ according to the polarity of the applied voltage even if the voltage of the same magnitude is applied.

For example, in a case where a variable resistance element is in a low resistance state, the magnitude of current flowing in the variable resistance element when a negative-polarity voltage of −1 V is applied thereto is larger than that of current flowing in the variable resistance element when a positive-polarity voltage of 1 V is applied to thereto. Therefore, if the variable resistance element has a switching characteristic as described above, the polarity determination circuit 118 may determine the negative-polarity voltage as a read voltage. In other words, information regarding the switching characteristic of the variable resistance element is stored in the polarity determination circuit 118, and the polarity of the read voltage can be determined based on the information.

In some embodiments, the polarity determination circuit 118 may determine as a read voltage one of a first candidate read voltage and a second candidate read voltage having different polarities, which enables a larger current to flow in the variable resistance element. The magnitude of the first candidate read voltage may be equal to that of the second candidate read voltage.

In some embodiments, the polarity determination circuit 118 applies the first candidate read voltage to the selected memory cell to determine the magnitude of a first current flowing in the variable resistance element, and applies the second candidate read voltage to the selected memory cell to determine the magnitude of a second current flowing in the variable resistance element. Then, the polarity determination circuit 118 selects the candidate read voltage associated with the larger one of the first current and the second current as the read voltage to be applied.

The polarity determination circuit 118 applies the first and second candidate read voltages to the respective memory cells included in the memory cell array 170 to determine the read voltage.

Figure 4:
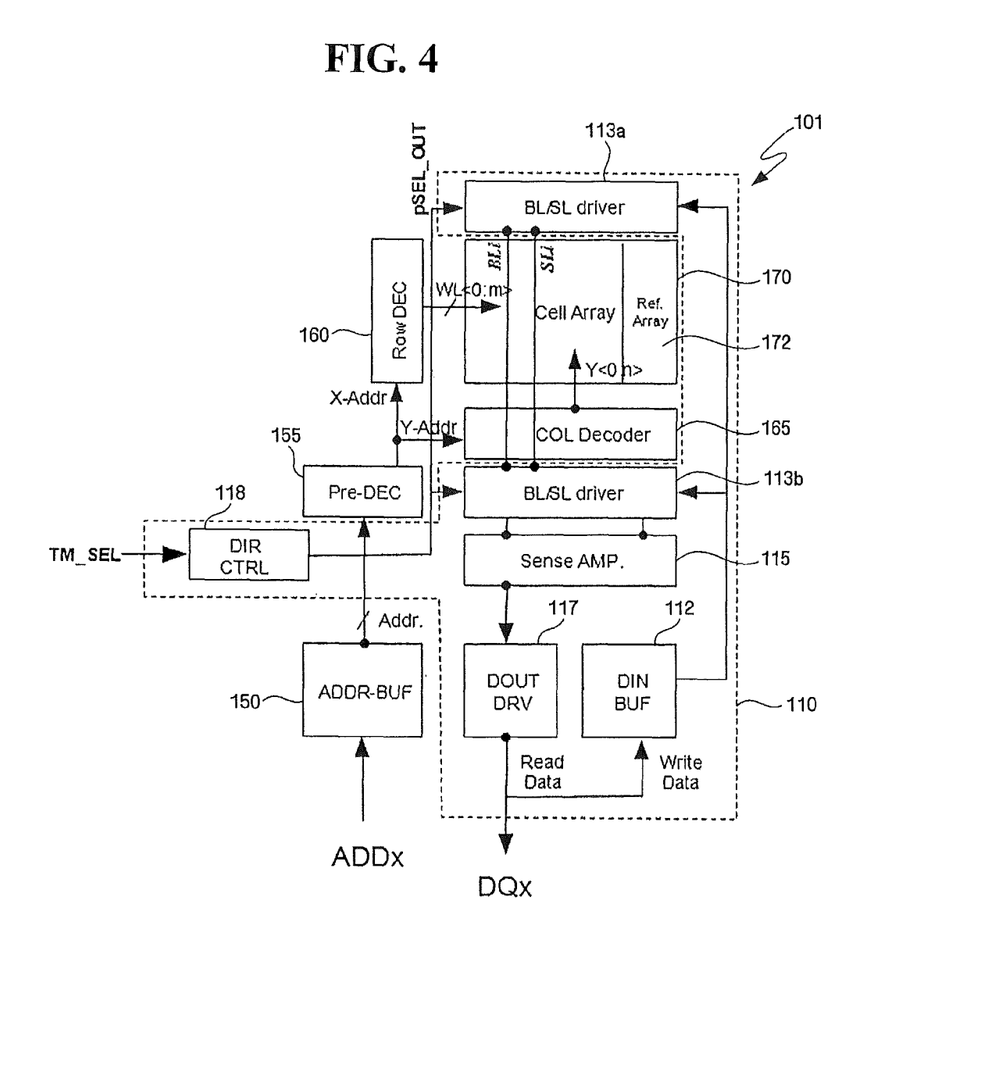
FIG. 4 is a block diagram illustrating a bidirectional resistive memory device according to another embodiment of the inventive subject matter.

In some embodiments, as shown in FIG. 4, the memory cell array 170 in a bidirectional resistive memory device 101 in may include a reference array 172 including at least one reference memory cell. The polarity determination circuit 118 tests the first candidate read voltage and the second candidate read voltage on the reference memory cell to selected as the read voltage one of the two candidate read voltages that enables a larger magnitude of current to flow in the variable resistance element. The polarity of the read voltage determined using the at least one reference memory cell can be applied to the plurality of memory cells included in the memory cell array 170. However, the magnitude of the read voltage is selected such that it is within a range in which a state of the resistance stored in the selected memory cell, e.g., a high resistance state or a low resistance state, does not change.

In bidirectional resistive memory devices according to some embodiments of the inventive subject matter, sensing speed can be increased by applying a read voltage enabling a larger current to flow in a variable resistance element to a selected memory cell in determining the polarity of the read voltage. In some embodiments, the variable resistance element may include a multi-level memory cell having three or more different resistance levels.

Figure 5:
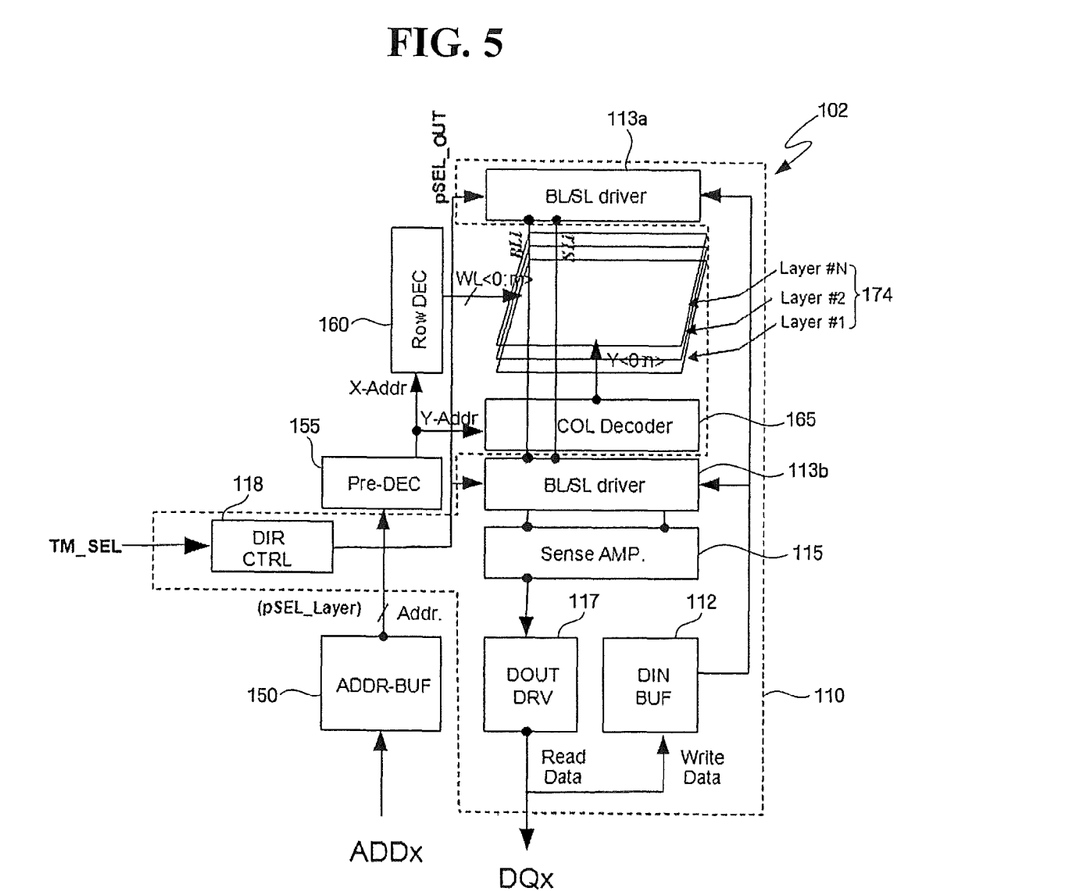
FIG. 5 is a block diagram illustrating a bidirectional resistive memory device according to still another embodiment of the inventive subject matter.

As shown in FIG. 5, a bidirectional resistive memory device 102 according to some other embodiments of the inventive subject matter may have a stacked memory cell array 174 having two or more memory layers Layer #1, Layer #2, . . . , Layer #N. The respective memory layers Layer #1, Layer #2, . . . , and Layer #N have different read polarities and read voltages. The read polarity and read voltage may be determined in the same manner as described above in the previous embodiments.

In more detail, the bidirectional resistive memory device 102 may have the stacked memory cell array 174 having two or more memory layers Layer #1, Layer #2, . . . and Layer #N, and a polarity determination circuit 118 is enabled by a polarity determination mode signal TM_SEL and outputs a polarity selection signal pSEL_OUT. Bit line and source line drivers 113*a* and 113*b* receive the polarity selection signal pSEL_OUT and apply a read voltage to a bit line and source line of each of the memory layers Layer #1, Layer #2, . . . , Layer #N. The read voltage applied to the two or more memory layers Layer #1, Layer #2, . . . , Layer #N may have different polarities.

In other words, like in the above-described embodiments, an input/output circuit 110 includes the polarity determination circuit 118 and the bit line and source line drivers 113*a* and 113*b*. The polarity determination circuit 118 determines the polarity of the read voltage applied to one selected among a plurality of memory layers of the stacked memory cell array 174. In addition, the bit line and source line drivers 113*a* and 113*b* apply a read voltage having the polarity determined by the polarity determination circuit 118 to opposite ends of the selected memory layer.

Further, in some other embodiments, similar to the device 101 shown in FIG. 4, the bidirectional resistive memory device 102 may include at least a portion of a memory layer of the memory cell array 174 used as a reference memory layer. The polarity determination circuit 118 tests a first candidate read voltage and a second candidate read voltage on the reference memory layer to determine as a read voltage one of the first candidate read voltage and the second candidate read voltage, which enables a larger current to flow in the variable resistance element.

The polarity of the read voltage determined using the at least one reference memory layer can be applied to the plurality of memory cells included in the memory cell array 174. However, the magnitude of the read voltage is determined within a range in which a state of the resistance stored in the variable resistance element, e.g., a high resistance state or a low resistance state, is not changed. In addition to the aforementioned techniques for providing the read voltage, various modified methods can be used within the scope of the inventive subject matter.

Figure 6:
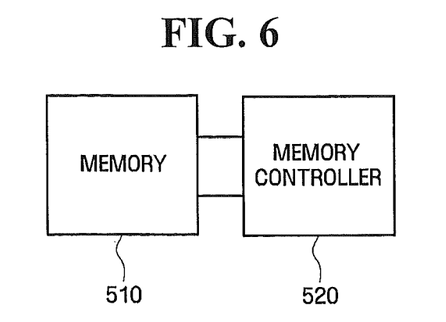
FIGS. 6 to 8 are diagrams illustrating examples of application of the bidirectional resistive memory device according to some embodiments of the inventive subject matter.
Figure 7:
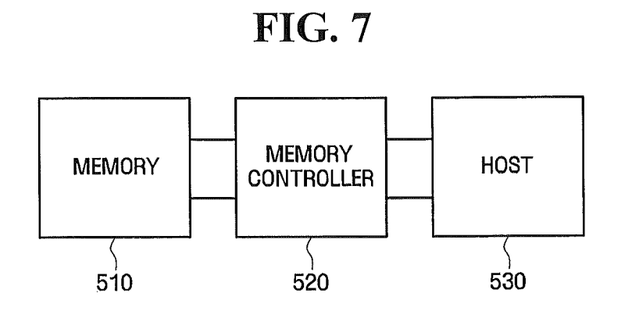
Figure 8:
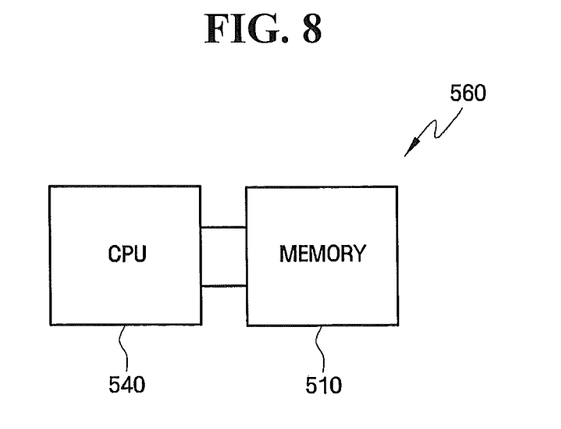

FIGS. 6 to 8 are diagrams illustrating examples of application of the bidirectional resistive memory device according to some embodiments of the inventive subject matter.

Referring to FIG. 6, a system according to some embodiments of the inventive subject matter includes a memory 510 that is connected to a memory controller 520. The memory 510 is a nonvolatile memory device formed according to the various embodiments of the inventive subject matter as described above, and the memory controller 520 provides input signals corresponding to the control of the operation of the memory, for example, a command signal for controlling a read operation and a write operation and an address signal, to the memory 510.

The system including the memory 510 and the memory controller 520, for example, may be embodied into an electronic card such as a memory card. Specifically, the system according to an embodiment of the inventive subject matter can be embodied in a card which satisfies a specified industry standard and may be included in, for example, a portable phone, a two-way communication system, a one-way pager, a two-way pager, a personal communication system, a portable computer, a personal data assistance (PDA), an audio and/or video player, a digital and/or video camera, a navigation system, a global positioning system (GPS), and the like. However, the use of the system according to an embodiment of the inventive subject matter is not limited thereto, and the system, for example, may be embodied in diverse forms such as a memory stick and so on.

Referring to FIG. 7, the system includes a memory 510, a memory controller 520 and a host system 530. Here, the host 530 is connected to the memory controller 520 through a bus and so on, and provides a control signal to the memory controller 520, so that the memory controller 520 can control the operation of the memory 510. The host 530, for example, may be a processor used in a portable phone, a two-way radio communication system, a one-way pager, a two-way pager, a personal communication system, a portable computer, a PDA, an audio and/or video player, a digital and/or video camera, a navigation system, a GPS, and the like.

In FIG. 7, the memory controller 520 is interposed between the memory 510 and the host 530. However, the position of the memory controller 520 is not limited thereto, and in the system according to another embodiment of the inventive subject matter, the memory controller 520 may be selectively omitted.

Referring to FIG. 8, a system according to another embodiment of the inventive subject matter may be a computer system 560 composed of a central processing circuit (CPU) 540 and a memory 510. In the computer system 560, the memory 510 is connected to the CPU 540 directly or using a typical computer bus architecture. The memory 510 may store an operation system (OS) instruction set, a basic input/output start up (BIOS) instruction set, an advanced configuration and power interface (ACPI) instruction set, and the like, or may be used as a large-capacity storage device such as a solid state disk (SSD).

For convenience in explanation, all constituent elements included in the computer system 560 are not illustrated in FIG. 8. Also, for convenience in explanation, the memory controller 520 between the memory 510 and the CPU 540 is omitted in FIG. 8. However, in still another embodiment of the inventive subject matter, the memory controller 520 may be interposed between the memory 510 and the CPU 540.

While the inventive subject matter has been particularly shown and described with reference to exemplary embodiments thereof, it will be understood by those of ordinary skill in the art that various changes in form and details may be made therein without departing from the spirit and scope of the inventive subject matter as defined by the following claims. It is therefore desired that the present embodiments be considered in all respects as illustrative and not restrictive, reference being made to the appended claims rather than the foregoing description to indicate the scope of the invention.

What is claimed is:

1. A memory device comprising:
 a memory cell array comprising a plurality of memory cells, each comprising a bidirectional variable resistance element; and
 an input/output circuit configured to determine a polarity for a read voltage to be applied to a selected memory cell among the plurality of memory cells and to apply the read voltage with the determined polarity to the selected memory cell, wherein the input/output circuit is configured to maintain a magnitude of the applied read voltage within a range in which a resistance state of the selected memory cell is not changed.

2. The memory device of claim 1, wherein the input/output circuit comprises:
 a polarity determination circuit configured to determine the polarity responsive to a determination mode signal; and
 a driver circuit configured to apply the read voltage with the determined polarity to the selected memory cell.

3. The memory device of claim 2, wherein the polarity determination circuit is configured to store polarity information for the selected variable resistance element and determines the polarity of the read voltage based on the stored polarity information.

4. The memory device of claim 1, wherein the input/output circuit is configured to evaluate candidate read voltages having different polarities and to responsively apply a selected one of candidate read voltages to the selected memory cell.

5. The memory device of claim 4, wherein the memory cell array comprises at least one reference memory cell, and wherein the input/output circuit is configured to evaluate the candidate read voltages using the reference memory cell.

6. The memory device of claim 1, wherein the variable resistance element is a bipolar element having a predetermined resistance value when the polarity of the read voltage applied is either positive or negative configured to enable current to flow in the variable resistance element.

7. The memory device of claim 1, wherein the variable resistance element comprises a non-ohmic material element and a resistive material element connected in series.

8. The memory device of claim 7, wherein the resistive material element comprises a phase change material, a transition metal oxide and/or a ferromagnetic material.

9. The memory device of claim 1, wherein the variable resistance element provides least three different resistance states, and wherein the memory cells are multi-level memory cells.

10. A memory device comprising:
 a memory cell array comprising a plurality of memory cells, each comprising a variable resistance element and a bidirectional access element; and
 an input/output circuit comprising a polarity determination circuit configured to determine a polarity of a read voltage to be applied to a selected memory cell among the plurality of memory cells and a bit line and source line driver circuit configured to apply the read voltage to a bit line and a source line such that the polarity determined by the polarity determination circuit is applied to the selected memory cell, wherein the polarity determination circuit is configured to identify which of a first candidate read voltage and a second candidate read voltage of different polarities enables a larger current to flow in the variable resistance element.

11. The memory device of claim 10, wherein the polarity determination circuit is configured to be enabled by a polarity determination mode signal and to output a polarity selection signal responsive to the determined polarity of the read voltage, and wherein the bit line and source line driver is configured to apply the read voltage to the bit line and the source line responsive to the polarity selection signal.

12. The memory device of claim 11, wherein the polarity determination circuit is configured to store information on the polarity of the read voltage corresponding to switching characteristics of the variable resistance element and to determine the polarity of the read voltage based on the information.

13. The memory device of claim 10, wherein the memory cell array comprises at least one reference memory cell, and wherein the polarity determination circuit is configured to test the first candidate read voltage and the second candidate read voltage on the reference memory cell to determine the polarity of the read voltage.

14. The memory device of claim 10, wherein the variable resistance element is a bipolar element having a predetermined resistance value when the polarity of the read voltage applied to opposite ends thereof is either positive or negative, and enabling current to flow in the variable resistance element.

15. The memory device of claim 10, wherein the variable resistance element comprises a non-ohmic material element and resistive material element connected in series.

16. The memory device of claim 15, wherein the resistive material element comprises a phase change material, a transition metal oxide and/or a ferromagnetic material.

17. The memory device of claim 10, wherein the variable resistance element has at least three different resistance levels, and wherein the memory cells are a multi-level memory cells.

18. The memory device of claim 10, wherein a magnitude of the read voltage is within a range in which a state of the resistance stored in the selected memory cell is not changed.

* * * * *